(12) United States Patent
Gangopadhyay

(10) Patent No.: US 6,316,346 B1
(45) Date of Patent: Nov. 13, 2001

(54) ANTIFUSE DEVELOPMENT USING $\alpha$-C:H,N, F THIN FILMS

(76) Inventor: Shubhra Gangopadhyay, 5403 93rd St., Lubbock, TX (US) 79424

( * ) Notice: Subject to any disclaimer, the term of this patent is extended or adjusted under 35 U.S.C. 154(b) by 0 days.

(21) Appl. No.: 09/654,868

(22) Filed: Sep. 5, 2000

Related U.S. Application Data

(62) Division of application No. 09/123,094, filed on Jul. 27, 1998, now Pat. No. 6,114,714, which is a continuation of application No. 08/743,638, filed on Nov. 4, 1996, now abandoned.
(60) Provisional application No. 60/007,151, filed on Nov. 7, 1995.

(51) Int. Cl.[7] .................. H01L 21/82; H01L 21/326; H01L 21/479; H01L 21/44
(52) U.S. Cl. .................. 438/600; 438/131; 438/467; 438/482
(58) Field of Search .................. 438/600, 482, 438/132, 131, 128, 467, 601

(56) References Cited

U.S. PATENT DOCUMENTS

| | | | |
|---|---|---|---|
| 4,630,355 | * 12/1986 | Johnson | 29/575 |
| 5,493,147 | * 2/1996 | Holzworth et al. | 257/530 |
| 5,825,072 | * 10/1998 | Yen et al. | 257/530 |
| 5,989,943 | * 11/1999 | Whitten et al. | 438/131 |

* cited by examiner

Primary Examiner—Richard Elms
Assistant Examiner—Adam Pyonin
(74) Attorney, Agent, or Firm—Groover & Associates; Robert Groover

(57) ABSTRACT

The present application discloses a method of forming and operating a metal-to-metal antifuse with an amorphous carbon dielectric which provides a very high resistance off state and can be programmed at voltages compatible with deep submicron devices. Furthermore, the programmed filament achieves low resistance with low programming current while maintaining a high level of stability.

4 Claims, 4 Drawing Sheets

ANTIFUSE DEVELOPMENT USING α-C:H,N, F THIN FILMS

CROSS-REFERENCE TO RELATED APPLICATION

This is a divisional of application Ser. No. 09/123,094, filed Jul. 27, 1998, which issued on Sep. 5, 2000 as U.S. Pat. No. 6,114,714, and which is itself a continuation of application Ser. No. 08/743,638 filed Nov. 4, 1996, abandoned.

This application claims priority from U.S. provisional application 60/007,151 filed Nov. 7, 1995, which is hereby incorporated by reference. However, the content of the present application is not necessarily identical to that of the priority application.

BACKGROUND OF THE INVENTION

The present invention relates to integrated circuit antifuse structures.

The first commercial antifuse based Field Programmable Gate Array (FPGA) employed an oxide/nitride/oxide (ONO) dielectric sandwiched between heavily doped polysilicon and a heavily doped diffusion in single crystal silicon. Because the antifuse is constructed on substrate next to the logic modules, this type of antifuse takes up valuable silicon area. In addition, because of reliability constraints, the programming voltage of this dielectric could not be scaled to less than about 14 volts. This causes an increasing problem as supply voltages are scaled.

The next commercial antifuse based FPGA employed an amorphous silicon antifuse dielectric sandwiched between two of the interconnect layers overlying the logic modules. This significantly reduced the size of the antifuse chip because antifuses could be constructed above rather than alongside the logic modules. In addition, the programming voltage was reduced to about 10 volts which helps with scaling supply voltages. The limitations of this dielectric are that (1) the programming voltage cannot be scaled below about 8 volts because of a rapid increase in off state leakage as the amorphous silicon thickness is reduced, and (2) a programming current of about 20 mA is required to stabilize the conductive filament. With amorphous silicon, insufficient programming current can result in a filament that will switch to a high resistance state during use. The amorphous carbon and nitrided amorphous carbon dielectrics described herein overcome many of these limitations. The programming voltage of the amorphous carbon dielectric antifuses can be scaled to less than 5 volts while still maintaining picoamp leakage current in the off state. The resistance of the programmed filament can be reduced to less than 100 ohms with 5 mA of programming current. Furthermore, the filament exhibits none of the resistance instability problems seen with amorphous silicon.

The present application discloses a metal-to-metal antifuse with an amorphous carbon dielectric which provides a very high resistance off state and can be programmed at voltages compatible with deep submicron devices. Furthermore, the programmed filament achieves low resistance with low programming current while maintaining a high level of stability.

One limitation of the hydrogenated amorphous carbon films is that they begin to evolve hydrogen and convert to low resistance graphite at temperatures above 250° C. This imposes a constraint on the maximum temperature that can be used in post antifuse processing of the integrated circuits. Either nitrogen and/or fluorine doping of hydrogenated films or the deposition of low hydrogen content amorphous carbon films stabilizes the films to temperatures exceeding 400° C. These temperatures are commonly used in back-end semiconductor processing.

The antifuse structure can be constructed between two of the interconnect layers overlying the logic modules in an FPGA, permitting a very compact layout. The antifuse structure consists of the bottom interconnect metal, the amorphous carbon dielectric, and the top interconnect metal. In between the interconnect metal layers and the amorphous carbon dielectric a layer of barrier metal such as TiW, Ti, or TiN, may be used.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1A:
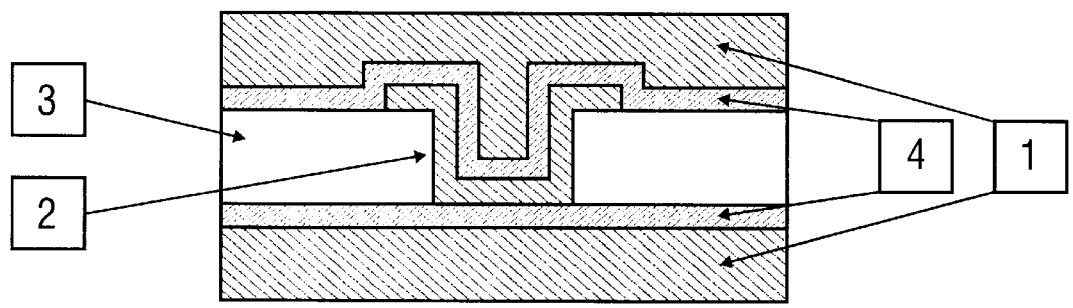
FIGS. 1A–1B show several embodiments of the physical structure of an antifuse.
Figure 1B:
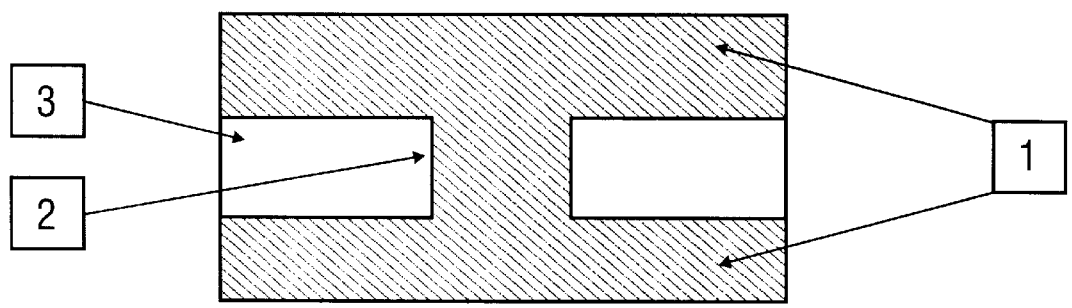

The numerous innovative teachings of the present application will be described with particular reference to the presently preferred embodiment (by way of example, and not of limitation), in which:

The antifuse structure is formed between interconnect layers in an integrated circuit as shown in FIGS. 1A and 1B. In FIGS. 1A and 1B, an thick amorphous carbon film 2 is deposited into a via opening that has been formed in the intermetal dielectric 3 between top and bottom interconnect layers 1. FIG. 1A shows the addition of barrier material 4 which is sometimes used in integrated circuits to enhance electromigration resistance of the aluminum interconnect layers.

The amorphous carbon dielectric can be deposited using sputtering or Electron Cyclotron Resonance (ECR) or Plasma Enhance Chemical Vapor Deposition (PECVD) equipment commonly used for thinfilm deposition in the semiconductor industry. Depending upon deposition conditions, film properties can range from a fine sooty lampblack-like material to a diamond like film. The preferred deposition conditions for the antifise dielectric produces a more diamond-like film. The preferred deposition gas for PECVD or ECR is $CH_4$ or a mixture of $CH_4$ and $NF_3$, but other carbon and nitrogen gases could be used as well. The preferred process for sputtering utilizes a graphite electrode and butane gas.

The preferred deposition conditions of the diamond-like amorphous carbon film (DLC) using PECVD plasma are
$CH_4$=200 sccm,
Pressure=2 Torr,
Substrate temperature=100° C., and
Power=100 Watts.
The optical band gap of the resulting material is 2.7 to 3 eV and the hydrogen content is at 50% to at 60%.

Figure 2:
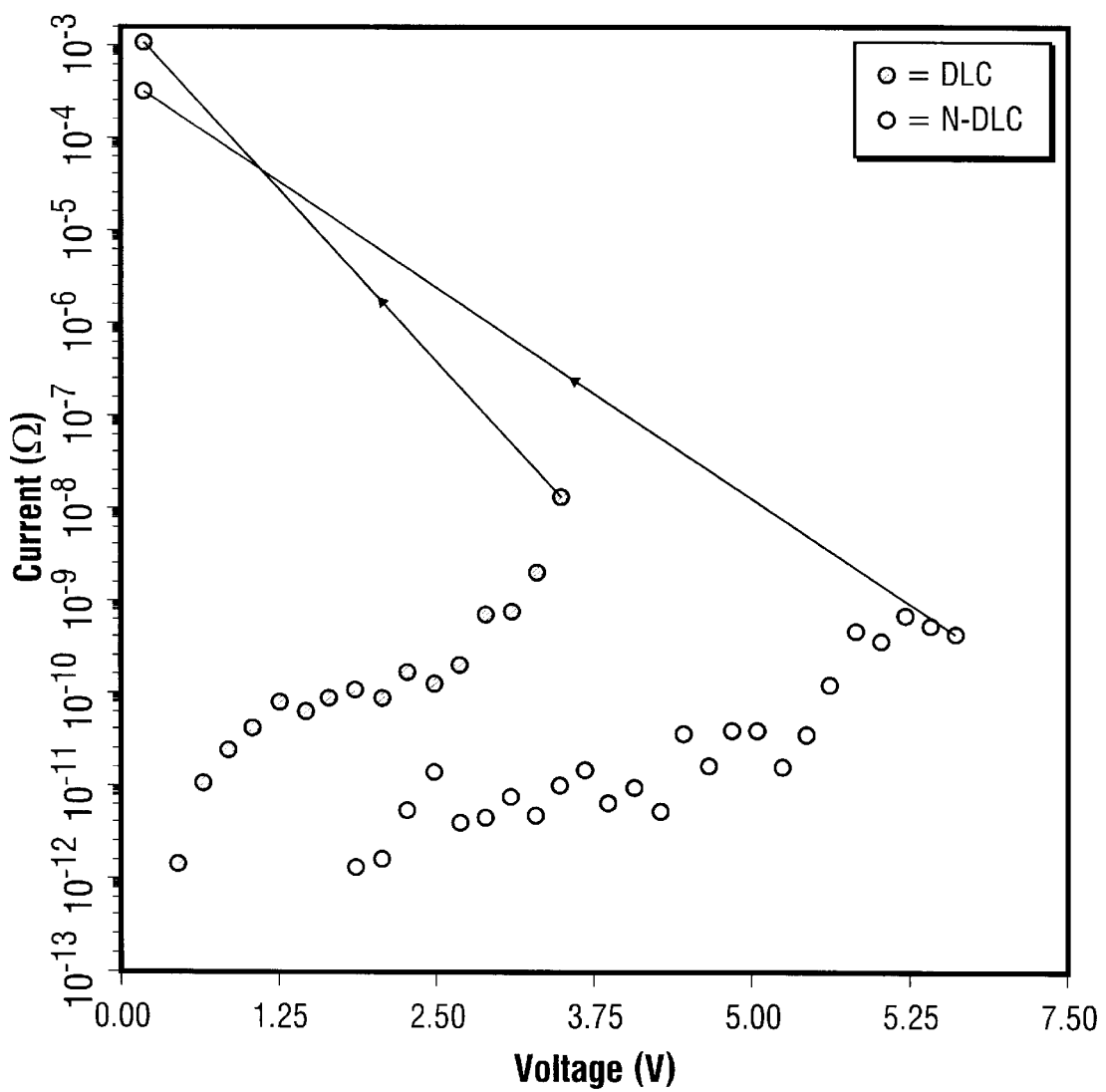
FIG. 2 shows leakage and breakdown characteristics of an antifuse structure.
Figure 3:
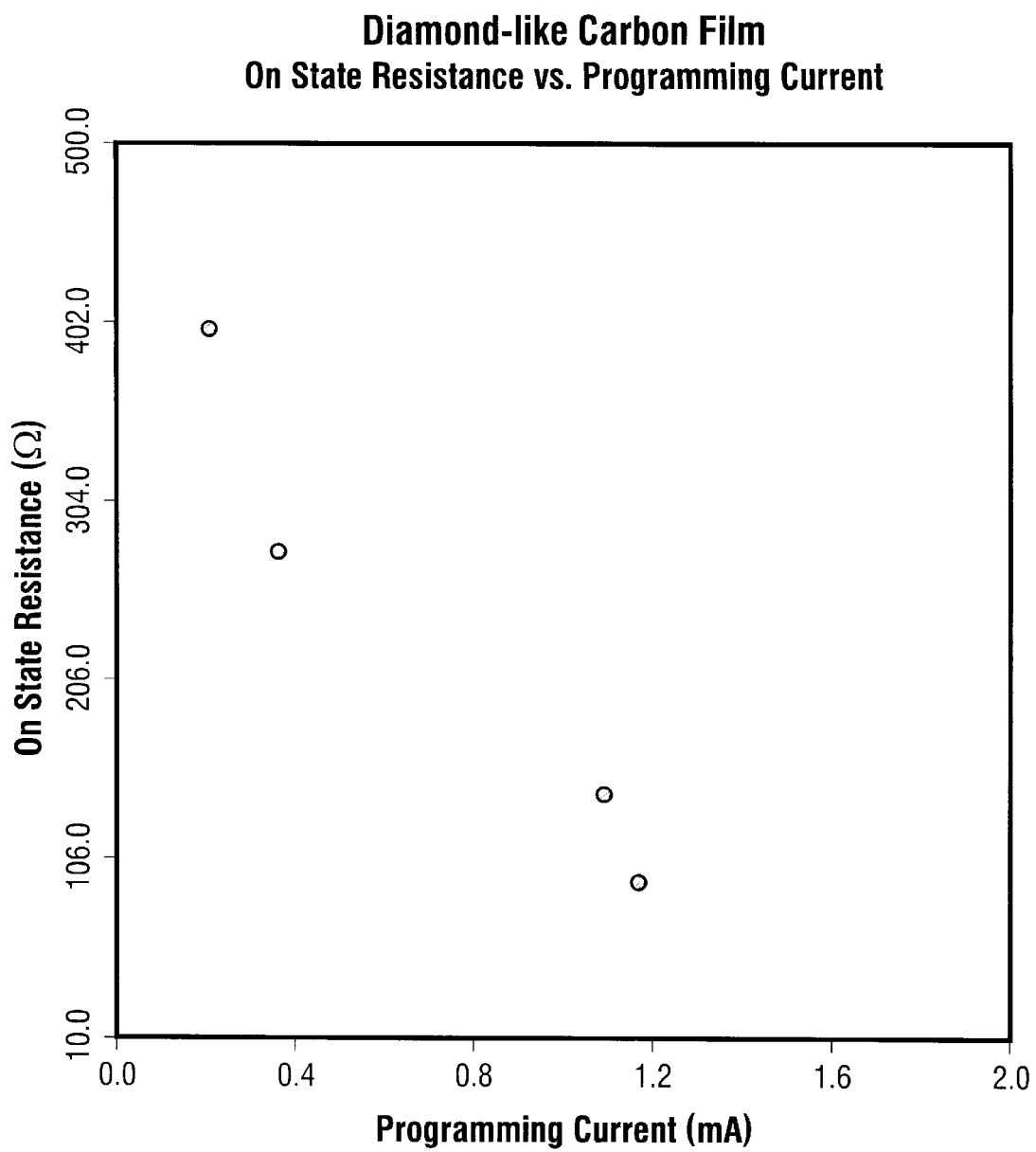
FIGS. 3 and 4 show the relation between filament resistance and programming current in an antifuse structure.

Leakage and breakdown characteristics of this film are FIG. 2. Leakage on this graph is the total leakage through the 0.2 $mm^2$ dot, and leakage is in the picoamp/$\mu m^2$ range up to a programming voltage of about 3 volts. This voltage can be adjusted by changing the amorphous carbon film thickness. The breakdown causes a low resistance filament to form. Filament resistance as a function of the programming current is shown in FIG. 3. A programming current of less than 2 mA is required to reduce the filament resistance to below 100 ohms. This filament is believed to be graphite-like in composition having a high level of stability. Subjecting this filament to prolonged current stress shows no resistance instability and none of the switching behavior characteristics of amorphous silicon films.

The preferred deposition conditions of the nitrogen doped, diamond-like, amorphous carbon film (N-DLC) using PECVD plasma are $CH_4$=200 SCCM, $NF_3$=20 SCCM, Pressure=2 Torr, Substrate temperature=100° C., and Power=100 Watts. Antifuse structures were formed by depositing an N-DLC film, having a thickness half that of the previous embodiment, onto a TiW substrate and then evaporating a 0.2 $mm^2$ aluminum top electrode through a shadow mask. Leakage and breakdown characteristics of this film are shown in FIG. 2. Leakage on this graph is the total leakage through the 0.2 $mm^2$ dot, and leakage is in the picoamp/$\mu m^2$ range up to programming voltage of about 6 volts. This voltage can be adjusted by changing the N-DLC film thickness.

Figure 4:
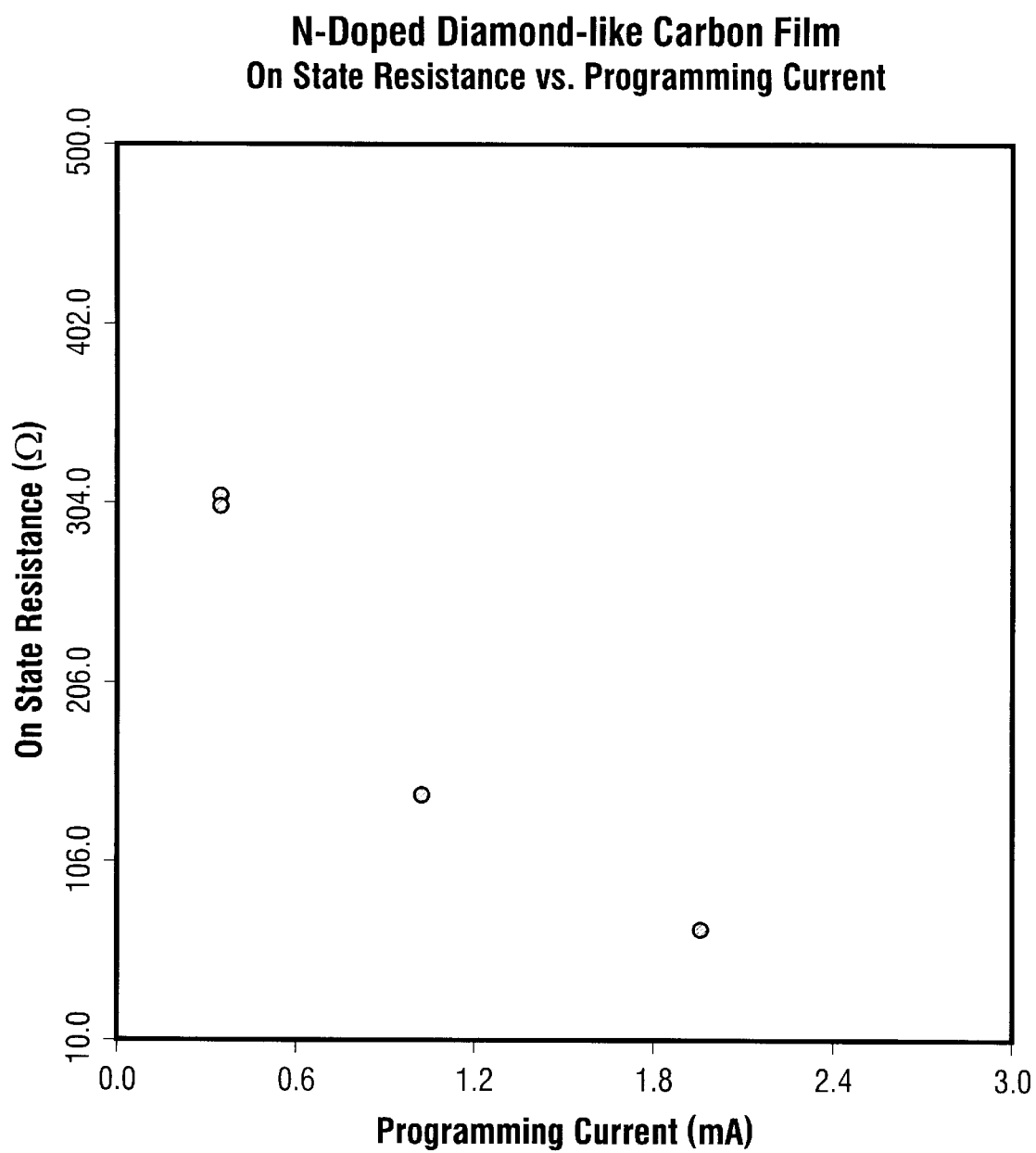

The breakdown causes a low resistance filament to form. Filament resistance as a function of the programming current is shown in FIG. 4. A programming current of less than 2 mA is required to reduce the filament resistance to below 100 ohms. This filament, like the DLC film, is very stable and shows no tendency to change resistance under prolonged current stress.

The DLC film shows a decrease in resistivity starting at about 200° C. The DLC film begins to evolve hydrogen at these temperatures and convert to a more graphite-like, conductive film. Nitrogen and fluorine doping increases the temperature stability of the film making it easier to integrate into the back-end interconnect part of semiconductor flows where temperatures are limited by the aluminum leads to 450° C. or less.

The temperature stability of DLC films is increased also by reducing the hydrogen content of the films. Reduction in the hydrogen content of the film by at 30% (to about at 35%) resulted in an increase in the breakdown voltage by a factor of two, and an increase in thermal stability up to 400° C. or more. The preferred method of depositing the reduced hydrogen amorphous carbon films is by reactive sputtering. The preferred deposition conditions for sputtering are: graphite electrode, butane gas, pressure=40 mtorr, cathode power=40 watts, substrate temperature=100° C., and anode bias of –60 Volts DC. The optical bandgap is 1.9 eV and the hydrogen content is approximately 35% at.

Antifuse structures were formed by depositing approximately 100 nm reduced hydrogen amorphous carbon films on top of a TiW substrate and then evaporating a 0.4$mm^2$ aluminum top electrode through a shadow mask. The leakage current is about 100 picvamps for a 0.4$mm^2$ antifuse capacitor. The device breaks down at about 14 Volts and filament resistance is 200 ohms at 0.3 mA programming current. No change in resistivity of the unprogrammed device occurs up to 400° C. anneal. The programming voltage of the reactively sputtered film can be reduced by reducing the film thickness.

The films described in the above application were deposited using PECVD ECR, or reactive sputtering but, as is known to those skilled in the art, other techniques can be used equally well to deposit these films. The gases of choice are $CH_4$ and $NF_3$, but other carbon and nitrogen containing gases could be used to deposit like films by those skilled in the art. The resistivity, breakdown voltage, and thermal stability of the amorphous carbon films can be controlled by varying the plasma parameters such as rf power, anode bias, gas pressure, gas composition, substrate temperature, and thickness of the film.

According to a disclosed class of innovative embodiments, there is provided an integrated circuit, comprising: an antifuse structure having first and second interconnect layers being disposed over logic modules, optional first and second barrier layers being disposed between said first and second interconnect layers, and an amorphous carbon dielectric layer being disposed between said first and second interconnect layers; whereby said dielectric layer can be programmed at voltages compatible with deep submicron devices.

According to another disclosed class of innovative embodiments, there is provided an antifuse structure, comprising: first and second interconnect layers being disposed over logic modules; first and second barrier layers being disposed between said first and second interconnect layers; and an amorphous carbon dielectric layer being disposed between said first and second barrier layers.

According to another disclosed class of innovative embodiments, there is provided a method of fabricating an antifuse structure, comprising the steps of: providing a substrate composed of a conductive material; depositing a dielectric film over said conductive material, patterning and etching an opening through the dielectric to said conductive layer, depositing an amorphous carbon film into the opening and contacting the lower said conductive film, and depositing a top layer of conductive film.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course, the specific etch chemistries, layer compositions, and layer thicknesses given are merely illustrative, and do not necessarily delimit the scope of the claimed inventions.

In particular, the disclosed antifuse structure can also be used with other materials for top or bottom contact. The use of metal layers as described is very convenient, but various other conductive materials can be used instead.

What is claimed is:

1. A method of fabricating an antifuse structure in an integrated circuit, comprising the steps of:

forming a first layer of conductive interconnects in said integrated circuit;

forming an antifuse layer primarily amorphous carbon over said first layer of conductive interconnects;

forming a second layer of conductive interconnects over said antifuse layer;

wherein said antifuse layer can be programmed at a voltage of less than about 8 volts.

2. The method of claim 1, wherein said antifuse layer can be programmed at a voltage of about 6 volts or less.

3. A method of operating an integrated circuit, comprising using a voltage of less than about 8 volts to program an antifuse structure which is formed in said integrated circuit and which primarily comprises amorphous carbon.

4. The method of claim 3, wherein said voltage is less than or equal to about 6 volts.

* * * * *